United States Patent [19]

Anthony et al.

[11] Patent Number: 5,419,798
[45] Date of Patent: May 30, 1995

[54] SUPPRESSION OF GRAPHITE FORMATION DURING LASER ETCHING OF DIAMOND

[75] Inventors: Thomas R. Anthony, Schenectady; James F. Fleischer, Scotia, both of N.Y.

[73] Assignee: General Electric Company, Schenectady, N.Y.

[21] Appl. No.: 248,896

[22] Filed: May 25, 1994

Related U.S. Application Data

[62] Division of Ser. No. 64,465, May 21, 1993, Pat. No. 5,334,280.

[51] Int. Cl.⁶ .................................................. C23F 1/02
[52] U.S. Cl. ..................................... 156/345; 118/728
[58] Field of Search ......................... 156/345, 643; 204/298.36, 157.41, 157.47; 118/728

[56] References Cited

U.S. PATENT DOCUMENTS

| | | | |
|---|---|---|---|
| 5,154,945 | 10/1992 | Baldwin | 427/596 |
| 5,250,137 | 10/1993 | Arami | 156/345 |
| 5,328,715 | 7/1994 | Iacovangelo | 427/97 |
| 5,328,855 | 7/1994 | Kitabatake | 437/25 |

OTHER PUBLICATIONS

"Processing of CVD diamond films by YAG laser" Tezuda, Japa Soc. of Precision Eng., vol. 56, No. 12, pp. 2255–2260, Dec. 1990.
"Excimer-laser etching of diamond and hard carbon films by direct writing and optical projection Rothschild", IEEE vol. 4, No. 1, pp. 310–314, Jan.–Feb. 1986 8 Ref.

*Primary Examiner*—Robert Kunemund
*Assistant Examiner*—Joni Y. Chang
*Attorney, Agent, or Firm*—William H. Pittman

[57] ABSTRACT

Graphite formation on a diamond surface during laser etching is inhibited or the graphite is removed by contact with a gaseous material such as elemental hydrogen, elemental oxygen, an inert gas or a source of hydroxyl radicals. Preferably, the article being etched is cooled and maintained in an inert atmosphere during etching.

7 Claims, 1 Drawing Sheet

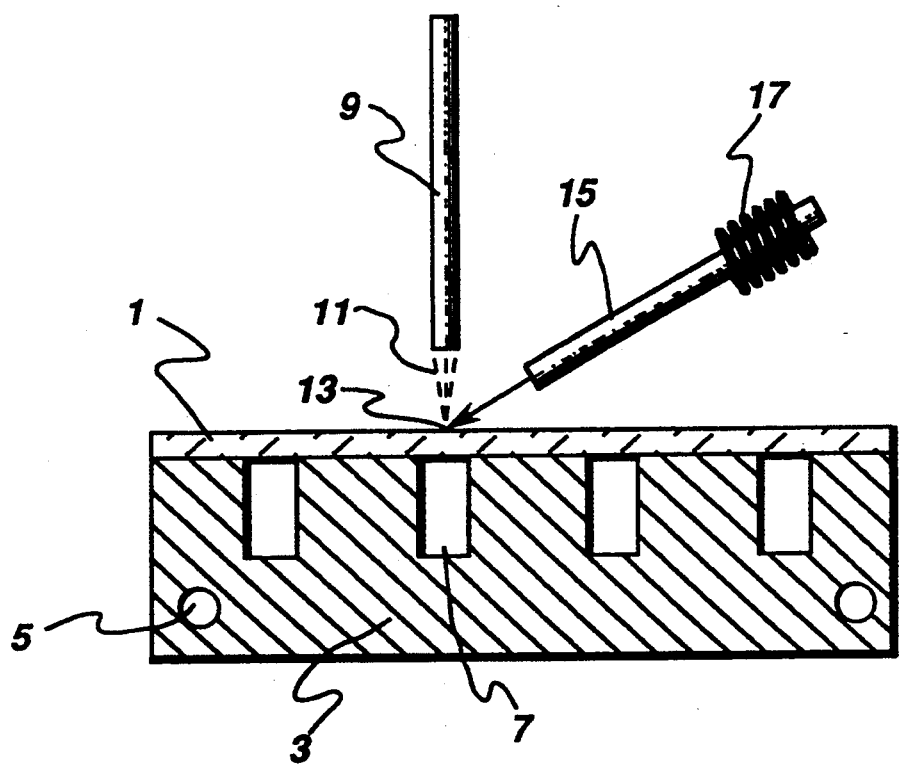

SUPPRESSION OF GRAPHITE FORMATION DURING LASER ETCHING OF DIAMOND

This application is a division of application Ser. No. 08/064,465, filed May 21, 1993, now U.S. Pat. No. 5,334,280.

This invention relates to the etching of diamond, and more particularly to a method of laser etching which suppresses graphite formation.

Diamond, both natural and synthetic, is increasingly being used as a heat sink material for electronic circuitry. It is particularly useful for this purpose because of its very high thermal conductivity.

It is generally necessary, when diamond is to be used in this way, to provide etched recesses in its surface for the purpose of mounting chips, diodes and the like. Being the hardest material known, diamond is not easy to etch. However, laser etching is practical and in wide use for diamond.

Laser etching is performed by contacting the diamond surface with a cutting laser. Even given diamond's high thermal conductivity, it is inevitably heated to very high temperatures at the precise point of cutting, frequently as high as 4000° C. While the temperature drops off rapidly at a distance from the point of cutting, temperatures above 1000° C. may be attained over a measurable area of the diamond surface.

At such temperatures, graphite may form on the surface, as the result of conversion of diamond or of vaporized carbon. If the graphite is allowed to remain, it can cause short circuits when the diamond is incorporated in electronic equipment. It can also decrease the resistivity of the heat sink, especially if a plurality of graphite-coated regions become connected.

Removal of graphite has typically required several steps subsequent to laser etching and metallization. The removal operation lowers the yield of useful diamond by disrupting metallization or oxidizing the metal deposited.

The present invention is generally directed to the prevention or suppression of graphite formation at the point of laser cutting of a diamond article. It is relatively simple and employs no additional steps after etching is completed.

In one of its aspects, the invention is a method for laser etching a diamond article which comprises contacting the region to be etched with a cutting laser and simultaneously contacting said article, at least at the point of etching, with a gaseous material effective to remove graphite or inhibit its formation.

The drawing is a cross-sectional view of a laser cutting apparatus useful for practicing the method of the invention.

Any type of diamond may be treated by the method of this invention. This includes both natural and synthetic diamond. The invention is particularly useful with synthetic diamond, and especially diamond deposited on a substrate by chemical vapor deposition by activation of a mixture of hydrogen and a hydrocarbon such as methane.

Methods for laser etching diamond are known. Any laser suitable for this purpose may be employed in the present invention. An illustration of a suitable laser is a neodymium-YAG laser.

The essential element of the method of the invention is contact of the diamond article being etched, at least at the point of etching, with a gaseous graphite-removing or graphite-inhibiting material. Such contact is typically produced by directing a stream of the desired gas at the diamond article at the point of laser etching, using a gas lance or equivalent device.

Various gases can be employed for this purpose. One example is an inert gas such as nitrogen, helium or argon, with helium and argon being preferred. When directed at the point of etching, said inert gas prevents deposition of vaporized carbon as graphite by blowing away any such carbon while it is in the gaseous state.

A second example is hydrogen. It is known to etch graphite at a much higher rate than it etches diamond, as a result of formation of atomic hydrogen which reacts with said graphite to form hydrocarbons.

It is also possible to employ gaseous materials capable of generating hydroxyl radicals at the temperature of laser etching. Such materials include water and volatile oxygenated organic compounds such as ethanol and acetone. The rate of reaction of hydroxyl radicals with graphite is even higher than that of atomic hydrogen, particularly above about 1200° C., and such radicals are therefore an effective graphite suppressant.

Still another suitable gaseous material is substantially pure (i.e., greater than about 95% pure) oxygen. It is converted to atomic oxygen at laser cutting temperatures, and said atomic oxygen very effectively etches graphite from the surface of the diamond with conversion to carbon monoxide or carbon dioxide.

A preferred embodiment of the invention includes cooling of the article being etched. Cooling is effective because the energy of activation for the conversion of diamond to graphite is 174 kcal., and the extent of conversion to graphite can therefore be substantially lowered by decreasing the temperature. In general, the temperature of the article should be decreased by at least about 10° C. from ambient temperature, i.e., to at most about 15° C. Lower temperatures, especially down to the temperature of liquid nitrogen (about $-196°$ C.) are even more effective.

Cooling may be achieved by any desired cooling means. Typically, a base element with relatively high thermal conductivity, typically of copper or the like, on which the article is mounted is cooled by at least one cooling coil through which a coolant such as liquid nitrogen, cold gas or the like is circulated. Said base generally has at least one groove or similar recess therein which follows the path of laser etching, to avoid liquefaction or vaporization of the base as a result of contact with or proximity to the laser.

A second preferred embodiment is maintenance of the article being etched in an inert atmosphere during laser cutting. Suitable inert gases include those described hereinabove.

Another aspect of the invention is apparatus for laser etching of a diamond article comprising a cutting laser maintained in etching relationship to said article and means for contacting said diamond at the point of etching with a gaseous material effective to remove graphite or inhibit its formation. Said apparatus also preferably comprises at least one of means, conventional in design, for maintaining said article in an inert atmosphere and cooling means for said article. Suitable means include gas sweep apparatus for the area being etched and an enclosing vessel adapted to be charged with an inert gas.

BRIEF DESCRIPTION OF THE DRAWINGS

FIG. 1 shows the diamond etching laser apparatus with the graphite suppression means.

Reference is now made to the drawing in which diamond article 1, deposited by chemical vapor deposition, is shown mounted on copper cooling element 3: Said cooling element is cooled by passage of a coolant such as liquid nitrogen or cold gas (e.g., nitrogen) through conduit 5, which may follow a serpentine pathway through said cooling element 3 as illustrated by the two points of cross-sectional sectional depiction shown. The cooling element is grooved, as illustrated by groove 7.

Laser 9 provides a beam 11 which etches diamond article 1 at 13. Said laser 9 may be moved in the direction of the desired etching, or the assembly including article 1 and cooling element 3 may be moved and the laser maintained stationary.

Gas lance 15, cooled by passage of a coolant through coil 17, directs a gaseous graphite-inhibiting or graphite-suppressing material into contact with article 1. The locations of laser 9 and gas lance 15 with respect to article 1 are maintained such that gas is directed at the precise point 13 where etching occurs. Said point of etching is maintained directly opposite groove 7, to avoid deleterious action on cooling element 3 by the heat generated during etching.

The invention is illustrated by a procedure in which a neodymium-YAG Q-switched laser with a CW output of 8 watts was operated at a wavelength of 1.06 microns with pulses of 200 nanoseconds at a repetition rate of 5000 pulses per second, and was repetitively passed over a diamond sheet 3 mm. thick, produced by chemical vapor deposition, so as to etch a line therein and ultimately cut the diamond sheet into two pieces. The sheet was suspended over a cavity by its edges and a hydrogen lance with an internal diameter of 1 mm. was employed to direct molecular hydrogen at 300 cm./sec. at the point of etching. About 15 passes were necessary to cut through the diamond sheet, and the resulting cut edge was lighter and cleaner than a comparable cut made without the hydrogen lance, as a result of suppression of graphite formation or removal of graphite. Further improvement could be expected upon employment of an inert atmosphere such as argon and cooling of the diamond article by means of a cooling element of the type shown in the drawing.

What is claimed is:

1. Apparatus for laser etching of a diamond article comprising a cutting laser maintained in etching relationship to said article and means for contacting said diamond at the point of etching with a gaseous material effective to remove graphite or inhibit its formation.

2. Apparatus according to claim 1 wherein said means for contacting is a gas lance.

3. Apparatus according to claim 2 which also comprises means for maintaining said article in an inert atmosphere.

4. Apparatus according to claim 1 further comprising cooling means for said article.

5. Apparatus according to claim 4 wherein said cooling means comprises a cooling element on which said article is mounted, said cooling element being cooled by passage of a coolant through it and being grooved in the direction of laser cutting.

6. Apparatus according to claim 5 wherein the cooling element is of copper.

7. Apparatus according to claim 6 which also comprises means for maintaining said article in an inert atmosphere.

* * * * *